United States Patent
Schnell et al.

(10) Patent No.: US 12,204,383 B2
(45) Date of Patent: Jan. 21, 2025

(54) THERMAL HEATSINK SYSTEMS AND METHODS IN INFORMATION HANDLING SYSTEMS

(71) Applicant: Dell Products, L.P., Round Rock, TX (US)

(72) Inventors: Arnold Thomas Schnell, Hutto, TX (US); Joseph Daniel Mallory, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 478 days.

(21) Appl. No.: 17/377,045

(22) Filed: Jul. 15, 2021

(65) Prior Publication Data
US 2023/0014167 A1 Jan. 19, 2023

(51) Int. Cl.
*G06F 1/20* (2006.01)
*H05K 7/20* (2006.01)

(52) U.S. Cl.
CPC ............ *G06F 1/20* (2013.01); *H05K 7/2039* (2013.01)

(58) Field of Classification Search
CPC . G06F 1/20; G06F 1/203; G06F 1/185; G06F 1/1658; G06F 1/1656; G06F 1/1633; H05K 7/2039; H05K 2201/10159; H05K 1/0203
See application file for complete search history.

(56) References Cited

U.S. PATENT DOCUMENTS

| | | | | |
|---|---|---|---|---|
| 5,313,097 A * | 5/1994 | Haj-Ali-Ahmadi | ............. | H01L 25/0652 257/E25.011 |
| 7,023,701 B2 * | 4/2006 | Stocken | ............. | H01L 23/4338 361/716 |
| 7,151,669 B2 * | 12/2006 | Liu | ............. | H01L 23/4093 165/185 |
| 7,289,331 B2 * | 10/2007 | Foster, Sr. | ............. | G06F 1/184 257/E23.102 |
| 2003/0169568 A1 * | 9/2003 | Tanaka | ............. | G06F 1/203 361/695 |
| 2012/0020004 A1 * | 1/2012 | Rau | ............. | H01L 23/473 361/679.31 |
| 2012/0113586 A1 * | 5/2012 | Rau | ............. | H01L 23/473 165/104.19 |
| 2012/0262875 A1 * | 10/2012 | Johnson | ............. | G11C 5/04 361/679.02 |

\* cited by examiner

*Primary Examiner* — Adam B Dravininkas
(74) *Attorney, Agent, or Firm* — Fogarty LLP

(57) ABSTRACT

Information handling system (IHS) heatsinking systems and methods may employ a thermally conductive compression attached memory module (CAMM) bolster plate affixed to one surface of a circuit board of the CAMM, between a central processing unit (CPU) of the IHS and memory devices mounted on the CAMM, to provide compression between the CAMM and a z-axis compression connector and to capture and dissipate heat from the CPU and the memory devices. Spacing between the CPU and the DIMM may enable this capture and dissipation of heat from the CPU. The bolster plate may be configured to receive at least one conductive fastener that bears on the bolster plate and presses the CAMM to the z-axis compression connector, and to conductively thermally couple the CAMM and bolster plate to a ground plane of a system printed circuit board (PCB) mounting the CPU and the CAMM.

16 Claims, 6 Drawing Sheets

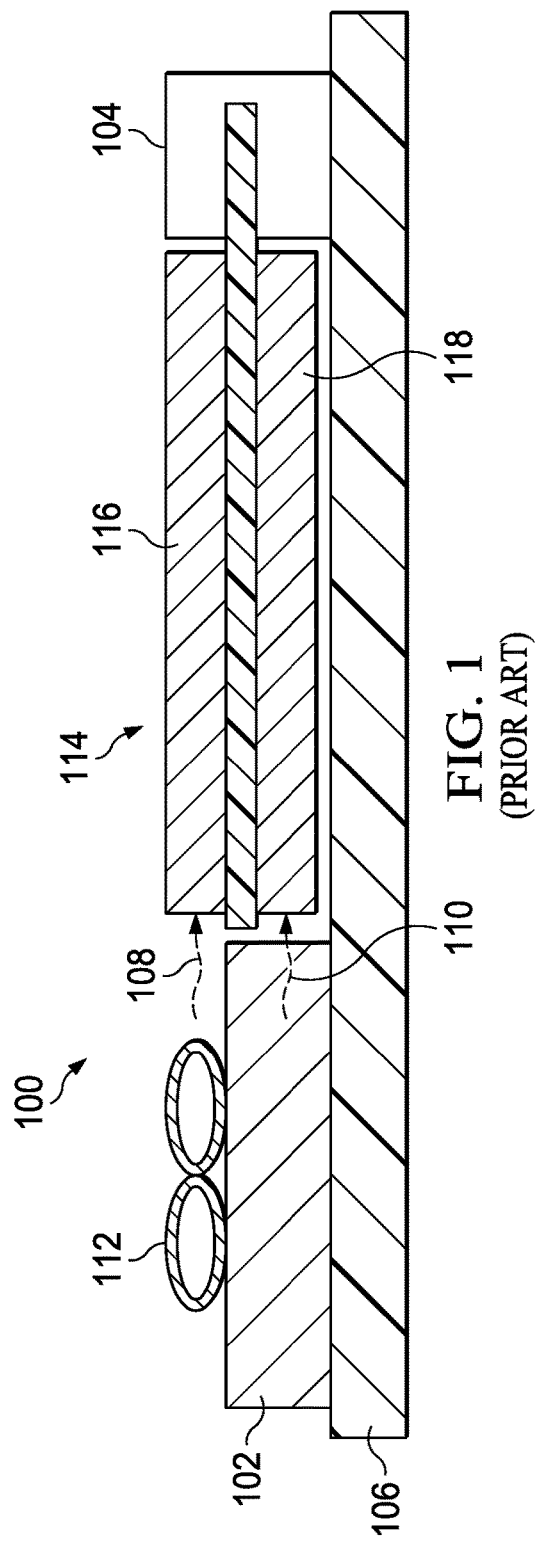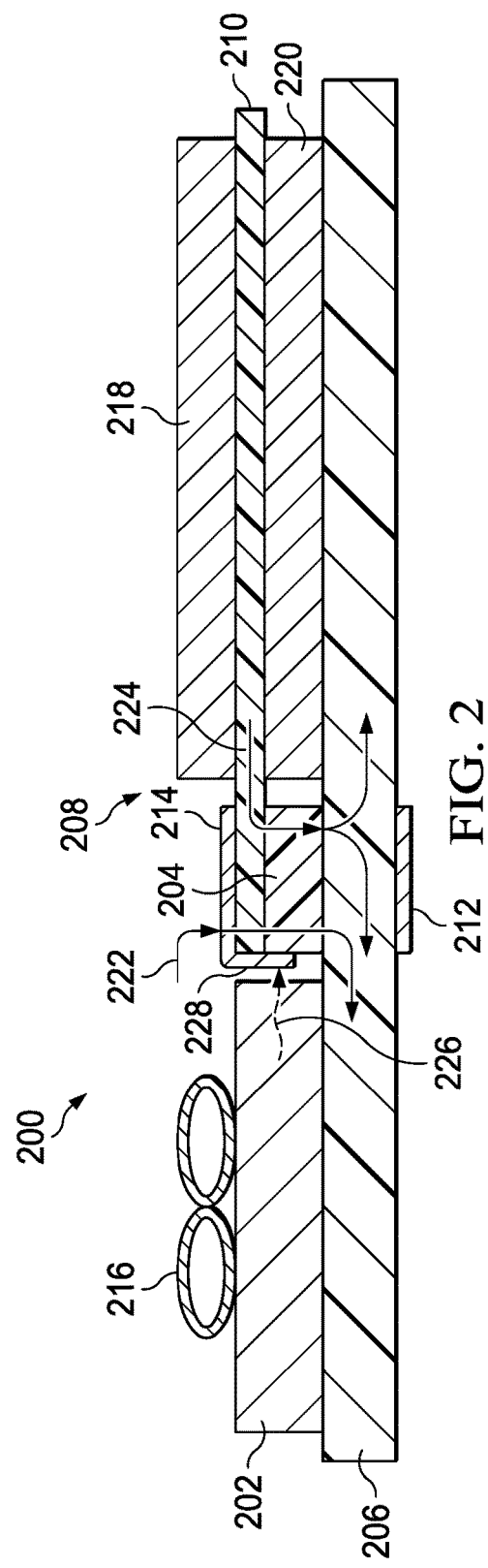

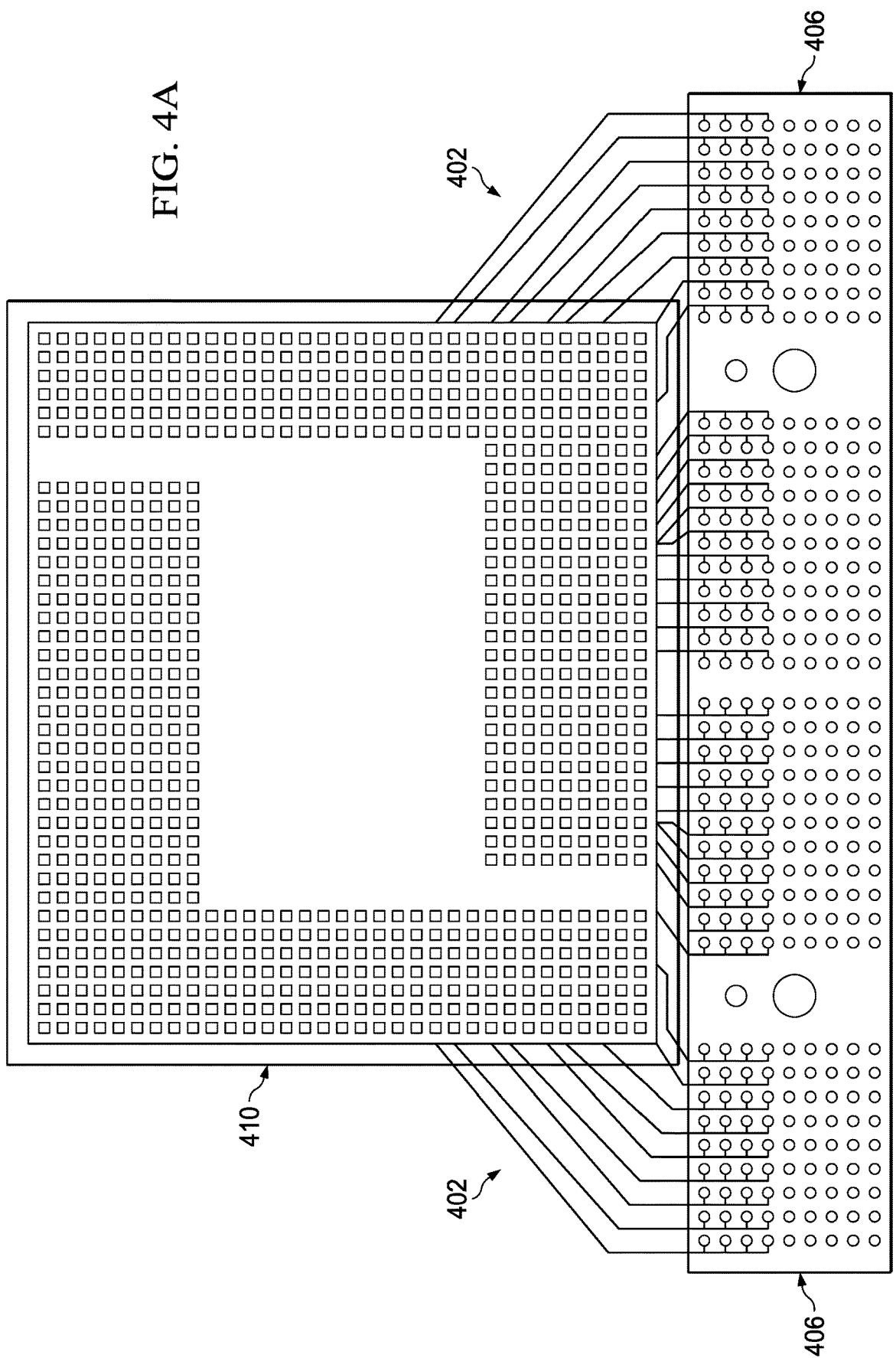

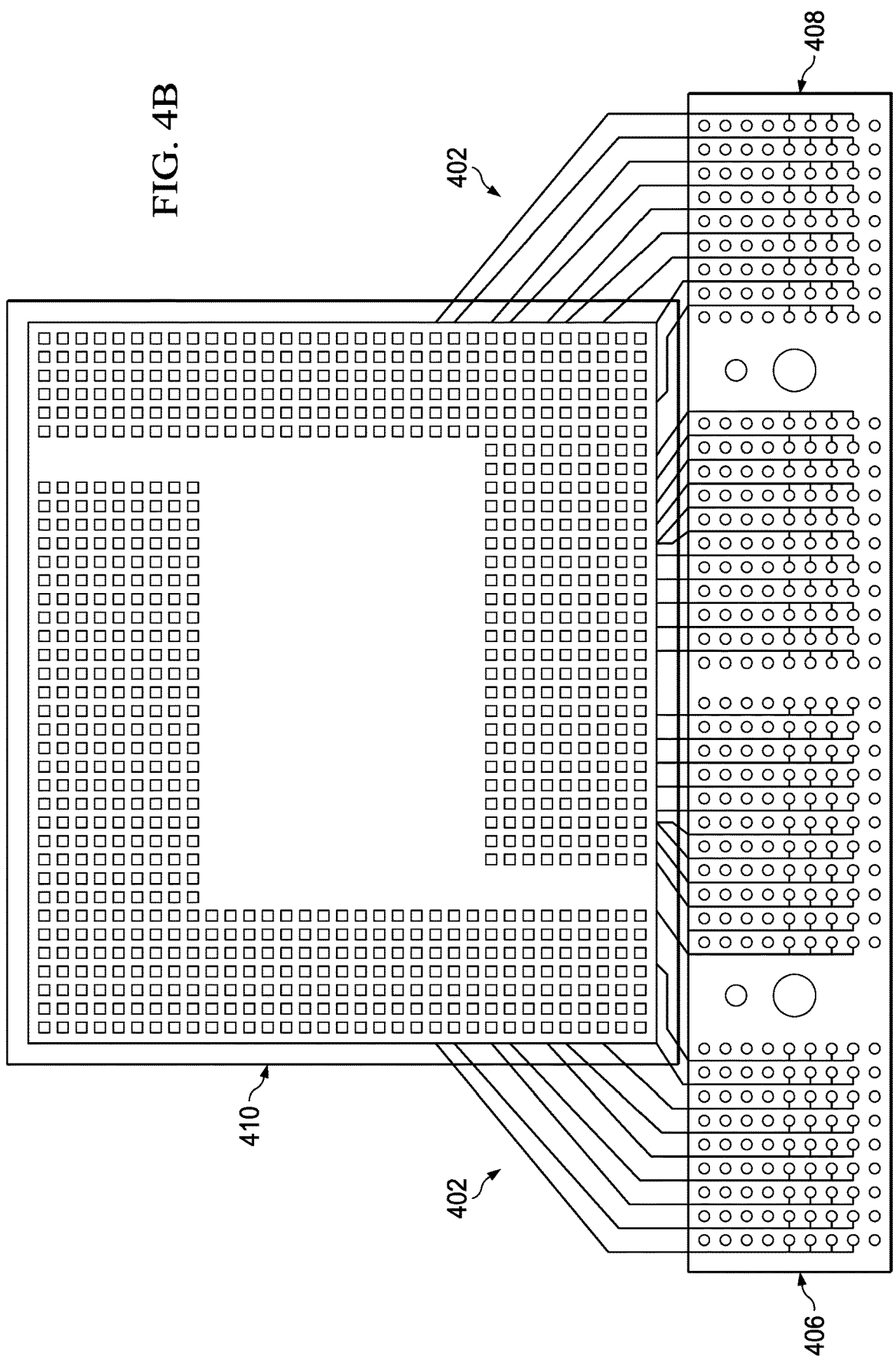

THERMAL HEATSINK SYSTEMS AND METHODS IN INFORMATION HANDLING SYSTEMS

FIELD

The present disclosure relates generally to Information Handling Systems (IHSs), and more particularly, to thermal heatsink systems and methods in IHSs employing Compression Attached Memory Modules (CAMMs).

BACKGROUND

As the value and use of information continue to increase, individuals and businesses seek additional ways to process and store it. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

SUMMARY

Thermal heatsink systems and methods in Information Handling Systems (IHSs) employing Compression Attached Memory Modules (CAMMs) are described. Such an IHS has a central processing unit (CPU) and employs one or more CAMMs, which include a plurality of memory devices mounted on at least one of surface of a circuit board of the CAMM and an array of surface contact connections, each surface contact connection configured to be engaged with an associated contact element of a z-axis compression connector. Herein, a thermally conductive heatsink bolster plate is affixed to one surface of the circuit board of the CAMM, between the CPU and the memory devices, to provide compression between the CAMM and the z-axis compression connector, and to capture and dissipate heat from the CPU and memory devices.

The memory devices may be accessed via at least one memory channel and the array of surface contact connections may be configured to conduct signals for the at least one memory channel, with length matching and impedance control of the at least one memory channel provided in the circuit board of the CAMM. An IHS system printed circuit board (PCB) mounting the CPU and the CAMM may include traces of a plurality of lengths providing system PCB portions of the at least one memory channel. The traces providing system PCB portions of the at least one memory channel may provide immediate proximate spacing between the CPU and the CAMM to enable the capture and dissipation of heat from the CPU by the thermally conductive heatsink bolster plate.

At least one conductive fastener may be configured to bear the thermally conductive heatsink bolster plate on the CAMM to provide the compression between the CAMM and the z-axis compression connector, and to conductively couple the CAMM and bolster plate to a ground plane of a system PCB mounting the CPU and the CAMM. The thermally conductive heatsink bolster plate and the conductive fastener(s) may be made of conductive metal. However, the thermally conductive heatsink bolster plate may be made of a thermally conductive and non-electrically conductive metal. The bolster plate may further include a generally perpendicular flange which is disposed between the CPU and the CAMM.

In an IHS having a vapor chamber disposed over the CPU, spacing between the CPU and the CAMM may enable the capture and dissipation of heat from the vapor chamber, via the thermally conductive heatsink bolster plate. Also grounding of the vapor chamber to a ground plane of the system PCB may enable the capture and dissipation of heat from the vapor chamber, as well.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIG. 1 is a fragmented, generally cross-sectional, diagrammatic illustration of a prior art Information Handling System (IHS), showing heat transfer between a Central Processing Unit (CPU) and a Small Outline Dual In-Line Memory (SODIMM) module.

FIG. 2 is a fragmented, generally cross-sectional, diagrammatic illustration of an IHS, showing thermal heatsinking, according to some embodiments of the present systems and methods.

FIGS. 4A and 4B are diagrammatic illustrations, together, showing memory channel routing between a Compression Attached Memory Module (CAMM) and a CPU, according to some embodiments of the present systems and methods.

DETAILED DESCRIPTION

Figure 3:
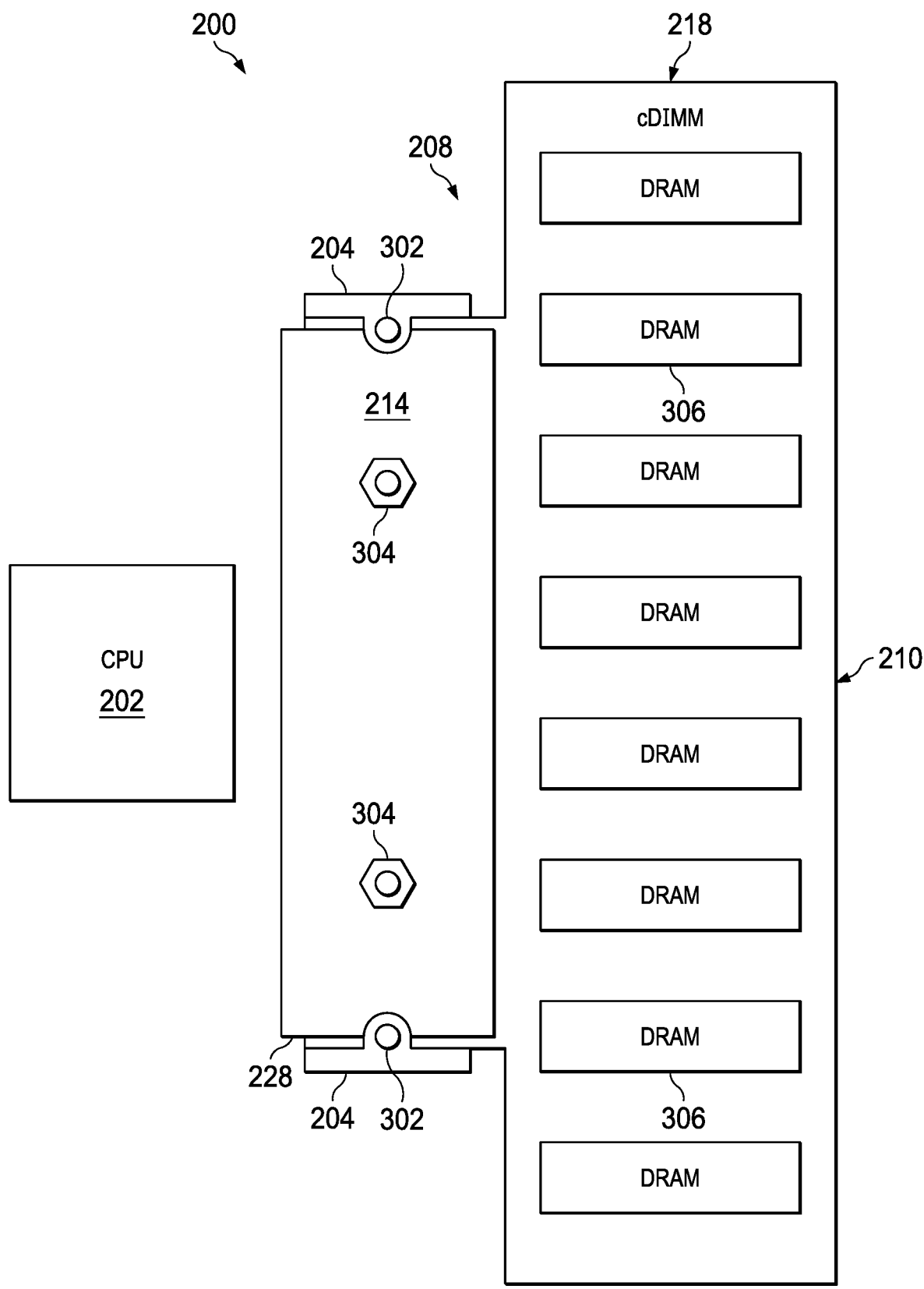
FIG. 3 is a fragmented diagrammatic top view of an IHS, showing thermal heatsinking, according to some embodiments of the present systems and methods.

FIG. 1 is a fragmented, generally cross-sectional, diagrammatic block side view illustration of prior art IHS 100. IHS 100 includes a processor, such as a CPU 102, and one or more Small Outline Dual In-Line Memory Module (SODIMM) connectors 104 assembled onto Printed Circuit Board (PCB) 106. FIG. 1 shows heat transfer 108 and 110 from CPU 102 and CPU cooler 112, respectively, to a SODIMM module 114 retained in connector 104. For system memory implementations using SODIMM connectors, the electrical design requires a certain minimum distance of the SODIMM connector from the CPU. This distance is required to ensure sufficient space for electrical signal routing on the system board (typically about 3 inches). This requirement forces the position of SODIMMs as shown in FIG. 1, such that the memory module is suspended over the system board above the memory routing. This arrangement places Dynamic Random Access Memory (DRAM) components disposed in usable DRAM areas 116 and 118 very close to CPU 102 and its thermal solution (cooler) 112, causing radiated heat 108, 110 to couple from the thermal solution, in particular, to DRAM components disposed in usable DRAM areas 116 and 118. Because SODIMM module 114 is suspended in air, there are no natural provisions to dispel this heat except through forced air. Most notebook IHSs do not incorporate forced air sufficiently in the memory area. Typically, DRAM chips are commonly rated at 85° C. or 95° C. as maximum junction temperatures. Higher temperatures have adverse effects on the performance and reliability of the DRAM. At critical temperatures, memory traffic is typically throttled down which affects CPU performance. IHSs with insufficient air flow must employ higher temperature DRAM which increases product cost.

Against this background, embodiments of the present systems and methods provide the aforementioned thermal heatsinking in IHSs employing Compression Attached Memory Modules (CAMMs) and thereby, systems and methods are described herein for thermal heatsinking in IHSs employing CAMMs.

Accordingly, using systems and methods described herein, an IHS (e.g., a handheld device, laptop, etc.) an IHS may employ a thermally conductive compression attached memory module (CAMM) bolster plate configured to be affixed to one surface of a circuit board of the CAMM, between a central processing unit (CPU) of the IHS and memory devices mounted on at least one surface of a circuit board of the CAMM. This bolster plate provides compression between the CAMM and a z-axis compression connector and captures and dissipates heat from the CPU and the memory devices. Spacing between the CPU and the DIMM may enable this capture and dissipation of heat from the CPU. Further, the bolster plate may be configured to receive at least one conductive fastener that bears on the bolster plate and presses the CAMM to the z-axis compression connector, to provide the compression between the CAMM and a z-axis compression connector, and to conductively couple the CAMM and bolster plate to a ground plane of a system printed circuit board (PCB) mounting the CPU and the CAMM. To such ends, the bolster plate and conductive fastener(s) may be made of conductive metal. However, the bolster plate may be is made of a thermally conductive, but non-electrically conductive metal. Further in this regard the bolster plate may have a generally perpendicular flange, disposed between the CPU and the CAMM. In some implementations, the bolster plate may be configured to be disposed immediately adjacent a vapor chamber disposed over the CPU, to capture and dissipate heat from the vapor chamber. Grounding of the vapor chamber to a ground plane of the system PCB may enable capture and dissipation of heat from the vapor chamber and bolster plate.

FIG. 2 is a fragmented, generally cross-sectional, diagrammatic side view of IHS 200, showing thermal heatsinking, according to some embodiments of the present systems and methods, and FIG. 3 is a fragmented diagrammatic top view of IHS 200, showing thermal heatsinking, according to some embodiments of the present systems and methods. IHS 200 includes a processor, CPU 202, and a CAMM compression connector 204 assembled onto an IHS system PCB 206. Compression connector 204 is populated with CAMM 208. Compression connector 204 may be a z-axis, or "vertical," compression connector that provides connection interface to, and stand-off from, system PCB 206. Compression connector 204 may include separate contact elements on a top surface of the compression connector, one for each signal line and power line. CAMM 208 includes surface contact connections defined in, such as in a bottom surface of, CAMM PCB 210. These CAMM contacts are pressed to engage with the contact elements of compression connector 204. Examples of compression connectors may include interposers, such as, cStack or mezzanine-type connectors from Amphenol, PCBeam connectors from Neoconix, or the like. CAMM 208 may be accessed by CPU 202 via both a first memory channel and a second memory channel through compression connector 204. In some embodiments, CAMM 208 may be accessed by CPU 202 via only one of the first memory channel or a second memory channel. Compression connector 204 includes contact elements associated with both memory channels. Compression connector 204, CAMM 208, and/or system PCB 206 may include one or more complementary alignment mechanisms 302, as shown in FIG. 3, that ensure the proper alignment of the CAMM to the compression connector system PCB 206.

Attachment of CAMM 208 to connector 204 may employ backing plate 212 attached at a bottom side of system PCB 206 and bolster 214 placed on top of CAMM 208 (e.g., CAMM PCB 210). CAMM backing plate 212 and bolster plate 214 provide mechanical support for necessary compression forces. Contact connections of connector 204 are brought into firm contact with the surface contact connections of CAMM 208 (i.e., CAMM PCB 210) by tightening bolster 214 against CAMM 208 (i.e., against CAMM PCB 210) such as by tightening, or otherwise engaging fastener 304, as shown in FIG. 3, for example, by tightening a nut to a screw extending from, or fitted through, backing plate 212, through system PCB 206, connector 204, CAMM PCB 210, and bolster 214. This screw and nut combination will be understood to be exemplary, and other through-hole fastener mechanisms may be utilized as needed or desired so as to press (and secure) CAMM 208 to connector 204. For example, the fastener may take the form of an internally threaded standoff extending from, or through, PCB 206, such as from backing plate 212, and a screw or bolt threaded into the standoff. In some embodiments, no backing plate is utilized, but the fastener mechanism interfaces directly with the bottom surface of system PCB 206. Also, in some embodiments, bolster 214 may be fashioned as flanged, L-shaped, as illustrated, to provide additional stiffness to the bolster to evenly maintain compression across the surface of CAMM 208 (i.e., CAMM PCB 210) and/or connector 204.

In some embodiments, connector 204 is surface-mount-attached (soldered) to a surface of system PCB 206, and CAMM 208 is removable. In various other embodiments, connector 204 is an interposer, or the like, and includes additional contact elements on a bottom surface, that is, the surface adjacent to system PCB 206, and both the connector and CAMM 208 are removable. In such embodiments, system PCB 206 will include surface contact elements on a surface of system PCB 206 that engage with the contact elements on the bottom side of interposer connector 204. In some embodiments, connector 204 may include a lever actuated compression device, or the like. When the lever is in a locked position, this lever actuated compression device retains CAMM 208, and when the lever is in an open position, the lever actuated compression device permits the removal of the CAMM. The mechanical arrangements for attaching CAMM 208 to connector 204, as described herein, will be understood to be exemplary and other mechanisms and arrangements for providing compression mounting of a CAMM to a compression connector, as are known in the art, may be utilized in accordance with the teachings of the present invention.

This CAMM-based IHS architecture places connector 204 in between the CPU 202 and CAMM memory module 208, providing distance between the heat source (CPU 202 and its thermal solution 216) and temperature sensitive DRAM ICs on CAMM 208. Embodiments of the present systems and methods may be employed in IHS 200, or the like, such as may include CPU 202 and a dual in-line memory module (DIMM), such as CAMM 208. CAMM 208 may have a plurality of memory devices, such as DRAM 306 in FIG. 3, mounted on at least one of surface of circuit board 210 of the CAMM 208, such as in available memory area 218 and/or 220. CAMM 208 may also have an array of surface contact connections, each surface contact connection configured to be engaged with an associated contact element of z-axis compression connector 204, as discussed above. In accordance with embodiments of the present systems and methods, thermally conductive heatsink bolster plate 214 is affixed to one surface of circuit board 210 of CAMM 208, between CPU 202 and the memory devices disposed in available memory area 218 and/or 220, to provide compression between the CAMM 208 and the z-axis compression connector 204, while capturing and dissipating heat 222 from CPU 202 and/or memory devices disposed in available memory area 218 and/or 220. Proximate spacing between CPU 202 and the CAMM 208 enables this capture and dissipation of heat 222 from the CPU. In accordance with various embodiments of the present systems and methods, the distance between CPU 202 and connector 204 may be about 100 mils (2.54 mm). In various embodiments, the connector may be implemented with fourteen contact rows with 1 mm spacing between rows. In such, and other embodiments, there may (resultingly) be about 18 mm between the edge of the CPU and the closest DRAM on CAMM 208. Not only spacing between CPU 202 and thermally conductive heatsink bolster plate 214 facilitates heatsinking in accordance with the present systems and methods, a heatsinking effect of connector 202 also draws the radiated heat such that the DRAM sees less radiated heat.

In accordance with various embodiments, thermally conductive CAMM bolster plate 214 disposed between CPU 202 of IHS 200 and memory devices mounted on at least one of surface of circuit board 210 of CAMM 208 may be pressed into IHS CAMM to z-axis compression connector 204 by at least one conductive fastener 304, as shown in FIG. 3, that bears on the bolster plate and presses the CAMM to the z-axis compression connector. For example, bolster plate 214 may be configured to receive at least one conductive fastener 304, as shown in FIG. 3, that bears on the bolster plate and presses CAMM 208 to the z-axis compression connector 204. Conductive fastener 304, as shown in FIG. 3, may conductively couple the CAMM 208 and bolster plate 214 to a ground plane of IHS system PCB 206. Thereby, bolster plate 214 capturing and dissipating heat from at least CPU 202, may include dissipating heat 222 from at least CPU 202 to the ground plane of the system PCB 206. Additionally, heat 226, such as from CPU 202 may be blocked and/or dissipated by connector 204, in various embodiments of the present systems and methods. Thermally conductive heatsink bolster plate 214 may dissipate some of heat 224 from memory devices disposed in available memory area 218 and/or 220. However, in accordance with various embodiments of the present systems and methods, the primary dissipation path for heat 224 from memory devices disposed in available memory area 218 and/or 220 to the ground planes in CAMM PCB 210, through the ground contacts within connector 204, to the ground planes within IHS PCB 206.

In accordance with various embodiments of the present systems and methods, bolster plate materials may be selected to ensure not only capture and dissipation of heat 222, but also heat transfer to the IHS system PCB ground planes. Therefore, in accordance with various embodiments of the present systems and methods, thermally conductive heatsink bolster plate 214 may be made of conductive metal, such as, a stainless steel, (an) aluminum (alloy), or the like. Likewise, conductive fastener(s) 304 may be made of the same, or other conductive metal, such as stainless steel, copper, brass, etc. Whereas conductive fastener(s) 304 may be made from a metal that is both thermally and electrically conductive, to provide both electrical and thermal conductivity to the ground plane of system PCB 206, thermally conductive heatsink bolster plate 214 may be made of a thermally conductive and non-electrically conductive metal (such as to avoid unintentional arcing, static discharge, or the like). As noted, thermally conductive bolster 214 may be fashioned as an L-shaped member, such as illustrated. This L-shape may be further conducive to enable thermal coupling between thermally conductive heatsink bolster plate 214 and CPU 202 (along with its thermal solution 216) by generally perpendicular flange 228 being disposed between the CPU (as well as its thermal solution) and CAMM 208 (and CAMM PCB 210 and memory devices 306).

While SODIMM layout requirements, as discussed above, with respect to FIG. 1 provide ample system board routing space for memory channel length matching and impedance control. That space has been generally eliminated in CAMM IHSs. Therefore, while some degree of length matching can still be carried out on CAMM IHS PCB 206 space is very limited. Therefore, other provisions may be made in CAMM IHSs for memory channel length matching and impedance control, in various embodiments a majority of length matching may be provided in CAMM PCB 210. The pinout of the CAMM connector can allow efficient routing from the CPU to the CAMM. Length matching can then be achieved on the CAMM PCB. FIGS. 4A and 4B are diagrammatic illustrations showing memory channel 0 routing 402 and memory channel 1 routing 404, respectively, between a CAMM and a CPU, such as from z-axis compression connector (e.g., an interposer) contacts 406 and 408, respectively to CPU surface-mount packaging ball grid array 410, according to some embodiments of the present systems and methods. Therein, traces 402 and/or 404 provide system PCB portions of (a) memory channel(s) that enable immediate, proximate spacing between IHS CPU (e.g., 202) and CAMM (e.g., 208) to enable the capture and dissipation of heat (e.g., heat 222 and/or 226) from the CPU and its cooling solution (e.g., 216). In such embodiments, IHS memory devices disposed in the available memory area of the CAMM may be accessed via least one memory channel 402 and/or 404, and in accordance with various embodiments of the present systems and methods, array 406 and 408 of surface contact connections are configured to conduct signals for the at least one memory channel, with length matching and impedance control of the memory channel(s) provided in the circuit board (e.g., 210) of the CAMM. In conjunction therewith, system PCB traces 402 and/or 404 providing system PCB portions of the memory channel(s) may be a plurality of lengths, with, as noted, length matching and impedance control of the memory channel(s) provided in the circuit board of the CAMM, such as by lengths of memory channel traces on the CAMM circuit board. Resultingly, embodiments of the present systems and methods, provide CAMM connector pinout 406 and 408 that will work across various CPU packages, which vary in their surface-mount packaging ball grid array (410) layout. Thus, embodiments of CAMM-based IHSs may, by way of example, be defined with fourteen rows with spacing of memory pins positioned to achieve routing on one layer per channel. Thus, as noted, in furtherance of embodiments of the present systems and methods, traces 402 and/or 404 providing system PCB portions of the memory channel(s) allow for immediate, proximate spacing between IHS CPU (e.g., 202) and CAMM (e.g., 208) to enable the capture and dissipation of heat from the CPU and its cooling solution (and memory devices disposed in the CAMM available memory area) such as by thermally conductive heatsink bolster plate 214. Pinout 406 and 408 of the CAMM may provide an array of ground pins that may, in accordance with various embodiments of the present systems and methods, facilitate heat transfer between the CAMM and IHS system PCB's (e.g., 206's) ground plane, such as in the manner discussed above, though a bolster plate fastener and/or standoff.

Figure 5:
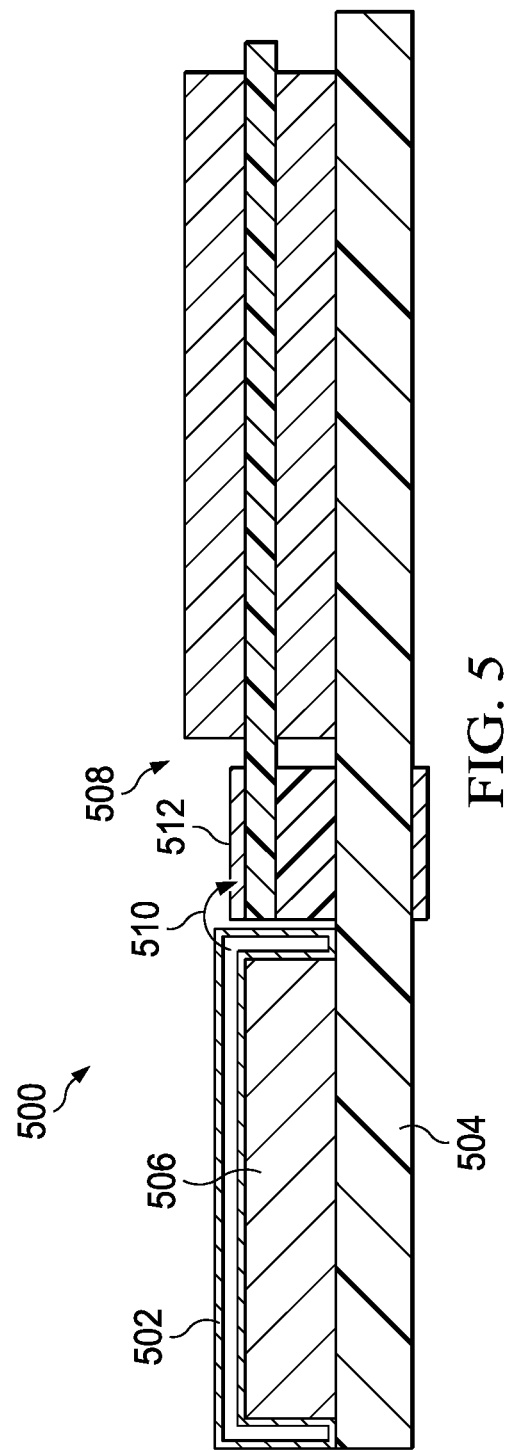
FIG. 5 is a fragmented, generally cross-sectional, diagrammatic illustration of an IHS using a vapor chamber CPU cooler, showing thermal heatsinking, according to some embodiments of the present systems and methods.

Some IHSs may implement a vapor chamber, or the like, as a CPU thermal solution. FIG. 5 is a diagrammatic illustration of IHS 500 using CPU vapor chamber 502, showing thermal heatsinking, according to some embodiments of the present systems and methods. Therein, system PCB 504 mounting the CPU 506 and CAMM 508 may employ vapor chamber 502, disposed over CPU 506. In accordance with embodiments of the present systems and methods, spacing between CPU 506 and CAMM 508, such as immediate, proximate spacing provided by memory channel routing in accordance with the above-discussed embodiments, may enable the capture and dissipation of heat 510 from vapor chamber 502, via thermally conductive heatsink bolster plate 512. In accordance with some embodiments, grounding of vapor chamber 502 to a ground plane of system PCB 504 may further enable the capture and dissipation of heat 510 from the vapor chamber, via such grounding of the vapor chamber.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 6:
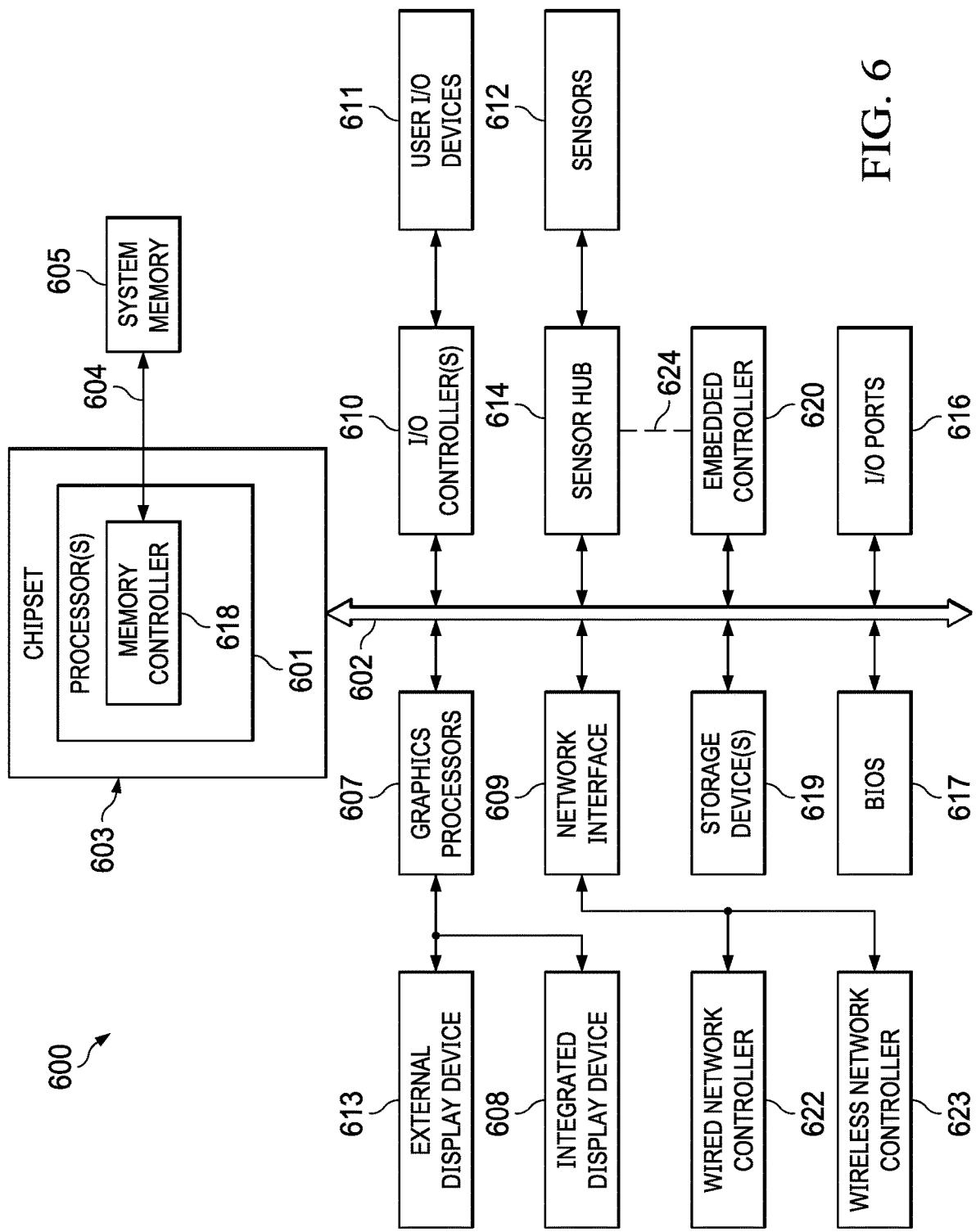
FIG. 6 is s a block diagram of an example of internal components of an IHS, according to some embodiments.

FIG. 6 is a block diagram of an example of internal components of IHS 600, according to some embodiments. As shown, IHS 600 includes one or more processors 601, such as a Central Processing Unit (CPU), that execute code retrieved from system memory 605. Although IHS 600 is illustrated with a single processor 601, other embodiments may include two or more processors, that may each be configured identically, or to provide specialized processing operations. Processor(s) 601 may include any processor capable of executing instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 6, processor(s) 601 includes memory controller 618 that may be implemented directly within the circuitry of processor(s) 601, or memory controller 618 may be a separate integrated circuit that is located on the same die as processor(s) 601. Memory controller 618 may be configured to manage the transfer of data to and from the system memory 605 of IHS 600 via high-speed memory interface 604. System memory 605 coupled to processor(s) 601 provides processor(s) 601 with a high-speed memory that may be used in the execution of computer program instructions by processor(s) 601. Accordingly, system memory 605 may include memory components, such as static RAM (SRAM), dynamic RAM (DRAM), NAND Flash memory, suitable for supporting high-speed memory operations by processor(s) 601. In certain embodiments, system memory 605 may combine both persistent, non-volatile memory and volatile memory. In certain embodiments, system memory 605 may include multiple removable memory modules.

IHS 600 utilizes chipset 603 that may include one or more integrated circuits that are connected to processor(s) 601. In the embodiment of FIG. 6, processor(s) 601 is depicted as a component of chipset 603. In other embodiments, all of chipset 603, or portions of chipset 603 may be implemented directly within the integrated circuitry of processor(s) 601. Chipset 603 provides processor(s) 601 with access to a variety of resources accessible via bus 602.

In IHS 600, bus 602 is illustrated as a single element. Various embodiments may utilize any number of separate buses to provide the illustrated pathways served by bus 602.

In various embodiments, IHS 600 may include one or more I/O ports 616 that may support removeable couplings with various types of external devices and systems, including removeable couplings with peripheral devices that may be configured for operation by a particular user of IHS 600. For instance, I/O 616 ports may include USB (Universal Serial Bus) ports, by which a variety of external devices may be coupled to IHS 600. In addition to or instead of USB ports, I/O ports 616 may include various types of physical I/O ports that are accessible to a user via the enclosure of IHS 600.

In certain embodiments, chipset 603 may additionally utilize one or more I/O controllers 610 that may each support the operation of hardware components such as user I/O devices 611 that may include peripheral components physically coupled to I/O port 616 and/or peripheral components that are wirelessly coupled to IHS 600 via network interface 609. In various implementations, I/O controller 610 may support the operation of one or more user I/O devices 610 such as a keyboard, mouse, touchpad, touchscreen, microphone, speakers, camera and other input and output devices that may be coupled to IHS 600. User I/O devices 611 may interface with an I/O controller 610 through wired or wireless couplings supported by IHS 600. In some cases, I/O controllers 610 may support configurable operation of supported peripheral devices, such as user I/O devices 611.

As illustrated, a variety of additional resources may be coupled to processor(s) 601 of IHS 600 through chipset 603. For instance, chipset 603 may be coupled to network interface 609 that may support different types of network connectivity. IHS 600 may also include one or more Network Interface Controllers (NICs) 622 and 623, each of which may implement the hardware required for communicating via a specific networking technology, such as Wi-Fi, BLUETOOTH, Ethernet and mobile cellular networks (e.g., CDMA, TDMA, LTE). Network interface 609 may support network connections by wired network controllers 622 and wireless network controllers 623. Each network controller 622 and 623 may be coupled via various buses to chipset 603 to support different types of network connectivity, such as the network connectivity utilized by IHS 600.

As illustrated, IHS 600 may support integrated display device 608, such as a display integrated into a laptop, tablet, 2-in-1 convertible device, or mobile device. IHS 600 may also support use of one or more external displays 613, such as external monitors that may be coupled to IHS 600 via various types of couplings, such as by connecting a cable from the external display 613 to external I/O port 616 of the IHS 600. One or more display devices 608 and/or 613 coupled to IHS 600 may utilize LCD, LED, OLED, or other display technologies. Each display device 608 and 613 may be capable of receiving touch inputs such as via a touch controller that may be an embedded component of display device 608 and/or 613 or graphics processor 607, or it may be a separate component of IHS 600 accessed via bus 602. In some cases, power to graphics processor 607, integrated display device 608 and/or external display 613 may be turned off or configured to operate at minimal power levels in response to IHS 600 entering a low-power state (e.g., standby). In certain scenarios, the operation of integrated displays 608 and external displays 613 may be configured for a particular user. For instance, a particular user may prefer specific brightness settings that may vary the display brightness based on time of day and ambient lighting conditions. As such, chipset 603 may provide access to one or more display device(s) 608 and/or 613 via graphics processor 607. Graphics processor 607 may be included within a video card, graphics card or within an embedded controller installed within IHS 600. Additionally, or alternatively, graphics processor 607 may be integrated within processor(s) 601, such as a component of a system-on-chip (SoC). Graphics processor 607 may generate display information and provide the generated information to one or more display device(s) 608 and/or 613, coupled to IHS 600.

Chipset 603 also provides processor(s) 601 with access to one or more storage devices 619. In various embodiments, storage device 619 may be integral to IHS 600 or may be external to IHS 600. In certain embodiments, storage device 619 may be accessed via a storage controller that may be an integrated component of the storage device. Storage device 619 may be implemented using any memory technology allowing IHS 600 to store and retrieve data. For instance, storage device 619 may be a magnetic hard disk storage drive or a solid-state storage drive. In certain embodiments, storage device 619 may be a system of storage devices, such as a cloud system or enterprise data management system that is accessible via network interface 609.

As illustrated, IHS 600 also includes Basic Input/Output System (BIOS) 617 that may be stored in a non-volatile memory accessible by chipset 603 via bus 602. Upon powering or restarting IHS 600, processor(s) 601 may utilize BIOS 617 instructions to initialize and test hardware components coupled to the IHS 600. BIOS 617 instructions may also load an operating system (OS) (e.g., WINDOWS, MACOS, iOS, ANDROID, LINUX, etc.) for use by IHS 600. BIOS 617 provides an abstraction layer that allows the operating system to interface with the hardware components of the IHS 600. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

As illustrated, certain IHS 600 embodiments may utilize sensor hub 614 capable of sampling and/or collecting data from a variety of hardware sensors 612. Sensors may provide access to data describing environmental and operating conditions of IHS 600 (e.g., accelerometers, gyroscopes, hinge sensors, rotation sensors, hall effect sensors, temperature sensors, voltage sensors, current sensors, IR sensors, photosensors, proximity sensors, distance sensors, magnetic sensors, microphones, ultrasonic sensors, etc.). Generally, in various implementations, processor 601 may receive and/or produce context information using sensors 612 including one or more of, for example: a user's presence state (e.g., present, near-field, mid-field, far-field, absent), a facial expression of the user, a direction of the user's gaze, a user's gesture, a user's voice, an IHS location (e.g., based on the location of a wireless access point or Global Positioning System), IHS movement (e.g., from an accelerometer or gyroscopic sensor), lid state (e.g., of a laptop), hinge angle (e.g., in degrees), IHS posture (e.g., laptop, tablet, book, tent, and display), whether the IHS is coupled to a dock or docking station, a distance between the user and at least one of: the IHS, the keyboard, or a display coupled to the IHS, a type of keyboard (e.g., a physical keyboard integrated into IHS 600, a physical keyboard external to IHS 600, or an on-screen keyboard), whether the user operating the keyboard is typing with one or two hands (e.g., holding a stylus, or the like), a time of day, software application(s) under execution in focus for receiving keyboard input, whether IHS 600 is inside or outside of a carrying bag, ambient lighting, a battery charge level, whether IHS 600 is operating from battery power or is plugged into an AC power source (e.g., whether the IHS is operating in AC-only mode, DC-only mode, or AC+DC mode), a power consumption of various components of IHS 600 (e.g., CPU 601, GPU 607, system memory 605, etc.), an operating temperature of components of IHS 600, such as CPU temperature, memory module temperature, etc. In certain embodiments, sensor hub 614 may be an independent microcontroller or other logic unit that is coupled to the motherboard of IHS 600. Sensor hub 614 may be a component of an integrated system-on-chip incorporated into processor 601, and it may communicate with chipset 603 via a bus connection such as an Inter-Integrated Circuit (I²C) bus or other suitable type of bus connection. Sensor hub 614 may also utilize an I²C bus for communicating with various sensors supported by IHS 600.

As illustrated, IHS 600 may utilize embedded controller (EC) 620, which may be a motherboard component of IHS 600 and may include one or more logic units. In certain embodiments, EC 620 may operate from a separate power plane from the main processors 601 and thus the OS operations of IHS 600. Firmware instructions utilized by EC 620 may be used to operate a secure execution system that may include operations for providing various core functions of IHS 600, such as power management, management of operating modes in which IHS 600 may be physically configured and support for certain integrated I/O functions. In some embodiments, EC 620 and sensor hub 614 may communicate via an out-of-band signaling pathway or bus 624.

In various embodiments, IHS 600 may not include each of the components shown in FIG. 6. Additionally, or alternatively, IHS 600 may include various additional components in addition to those that are shown in FIG. 6. Furthermore, some components that are represented as separate components in FIG. 6 may in certain embodiments instead be integrated with other components. For example, in certain embodiments, all or a portion of the functionality provided by the illustrated components may instead be provided by components integrated into the one or more processor(s) 601 as an SoC.

Accordingly, systems and methods described herein provide IHS heatsinking by pressing an IHS compression attached memory module (CAMM) to a z-axis compression connector using a thermally conductive (flanged) CAMM bolster plate disposed between a central processing unit (CPU) of the IHS and memory devices mounted on at least one of surface of a circuit board of the CAMM, by at least one conductive fastener that bears on the bolster plate and presses the CAMM to the z-axis compression connector, conductively coupling the CAMM and bolster plate to a ground plane of a system PCB mounting the CPU and the CAMM, the bolster plate capturing and dissipating heat from at least the CPU, including dissipating heat from at least the CPU to the ground plane of the system PCB.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An information handling system (IHS) heatsink comprising a thermally conductive compression attached memory module (CAMM) bolster plate affixed to one surface of a circuit board of a CAMM, between a central processing unit (CPU) of the IHS and memory devices mounted on at least one surface of a circuit board of the CAMM, to provide compression between the CAMM and a z-axis compression connector and to capture and dissipate heat from the CPU and the memory devices, and wherein the bolster plate is configured to receive at least one conductive fastener that bears on the bolster plate and presses the CAMM to the z-axis compression connector, to provide the compression between the CAMM and a z- axis compression connector and conductively couple the CAMM and bolster plate to a ground plane of a system printed circuit board (PCB) mounting the CPU and the CAMM.

2. The heatsink of claim 1, wherein spacing between the CPU and the CAMM enables the capture and dissipation of heat from the CPU.

3. The heatsink of claim 1, wherein the bolster plate and the at least one conductive fastener are made of conductive metal.

4. The heatsink of claim 1, wherein the bolster plate further comprises a generally perpendicular flange disposed between the CPU and the CAMM.

5. The heatsink of claim 1, wherein the bolster plate is configured to be disposed immediately adjacent a vapor chamber disposed over the CPU to capture and dissipate heat from the vapor chamber.

6. The heatsink of claim 5, wherein grounding of the vapor chamber to a ground plane of the system PCB enables the capture and dissipation of heat from the vapor chamber.

7. An information handling system (IHS), comprising:
 a central processing unit (CPU) CPU;
 a compression attached memory module (CAMM) comprising:
  a plurality of memory devices mounted on at least one of surface of a circuit board of the CAMM; and
  an array of surface contact connections, each surface contact connection configured to be engaged with an associated contact element of a z-axis compression connector;
 a thermally conductive heatsink bolster plate affixed to one surface of the circuit board of the CAMM, between the CPU and the memory devices, to provide compression between the CAMM and the z-axis compression connector, and to capture and dissipate heat from the CPU and memory devices; and a system PCB mounting the CPU and the CAMM and a vapor chamber disposed over the CPU, wherein spacing between the CPU and the CAMM enables the capture and dissipation of heat from the vapor chamber, via the thermally conductive heatsink bolster plate.

8. The IHS of claim 7, wherein the memory devices are accessed via at least one memory channel and the array of surface contact connections are configured to conduct signals for the at least one memory channel, length matching and impedance control of the at least one memory channel provided in the circuit board of the CAMM.

9. The IHS of claim 8, further comprising a system printed circuit board (PCB) mounting the CPU and the CAMM, the system PCB comprising traces of a plurality of lengths providing system PCB portions of the at least one memory channel.

10. The IHS of claim 9, wherein the traces providing system PCB portions of the at least one memory channel provide immediate proximate spacing between the CPU and the CAMM to enable the capture and dissipation of heat from the CPU by the thermally conductive heatsink bolster plate.

11. The IHS of claim 7, further comprising at least one conductive fastener configured to bear the thermally conductive heatsink bolster plate on the CAMM to provide the compression between the CAMM and the z-axis compression connector, and to conductively couple the CAMM and bolster plate to a ground plane of a system PCB mounting the CPU and the CAMM.

12. The IHS of claim 11, wherein the thermally conductive heatsink bolster plate and the at least one conductive fastener are made of conductive metal.

13. The IHS of claim 7, wherein the bolster plate further comprises a generally perpendicular flange disposed between the CPU and the CAMM.

14. The IHS of claim 7, wherein grounding of the vapor chamber to a ground plane of the system PCB enables the capture and dissipation of heat from the vapor chamber.

15. An information handling system (IHS) heatsinking method comprising pressing an IHS compression attached memory module (CAMM) to a z-axis compression connector using a thermally conductive CAMM bolster plate disposed between a central processing unit (CPU) of the IHS and memory devices mounted on at least one of surface of a circuit board of the CAMM, by at least one conductive fastener that bears on the bolster plate and presses the CAMM to the z-axis compression connector, conductively coupling the CAMM and bolster plate to a ground plane of a system printed circuit board (PCB) mounting the CPU and the CAMM, the bolster plate capturing and dissipating heat from at least the CPU, including dissipating heat from at least the CPU to the ground plane of the system PCB.

16. The method of claim 15, wherein the bolster plate further comprises a generally perpendicular flange and the method further comprises disposing the flange between the CPU and the CAMM.

* * * * *